July 27, 1971 J. THIRÉ ET AL 3,595,715

METHOD OF MANUFACTURING A SEMICONDUCTOR DEVICE COMPRISING A JUNCTION FIELD-EFFECT TRANSISTOR

Filed July 1, 1968 2 Sheets-Sheet 1

INVENTORS
JACQUES THIRÉ
RENÉ GLAISE
BY
AGENT

INVENTORS
JACQUES THIRÉ
RENÉ GLAISE
BY

AGENT

United States Patent Office 3,595,715
Patented July 27, 1971

3,595,715

METHOD OF MANUFACTURING A SEMICONDUCTOR DEVICE COMPRISING A JUNCTION FIELD-EFFECT TRANSISTOR

Jacques Thiré and René Glaise, Caen-Calvados, France, assignors to U.S. Philips Corporation, New York, N.Y.
Filed July 1, 1968, Ser. No. 741,748
Claims priority, application France, June 30, 1967, 112,635
Int. Cl. H01l 7/36, 7/44
U.S. Cl. 148—175 3 Claims

ABSTRACT OF THE DISCLOSURE

A method is described for making a junction field effect transistor using two opposite-type buried layers in a substrate, and a single epitaxial layer. The top buried layer forms with a region diffused from the surface a cup-shaped volume constituting a control electrode. The channel, of epitaxial material, is defined by a surface diffusion within the cup. The bottom buried layer isolates the transistor from the substrate.

The invention relates to a method of manufacturing a semiconductor device comprising a substrate on which an epitaxial layer of the one conductivity type is arranged so as to be separated therefrom by a pn-junction, said epitaxial surface layer being divided into relatively isolated islands in at least one of which a field-effect transistor having a channel zone of the one conductivity type and a control-electrode with a diffused surface region is arranged.

In the manufacture of monolithic integrated circuits various active semiconductor elements such as diode and transistors or passive elements such as resistors and capacitors are provided simultaneously by a minimum number of treatments on a body of the substrate.

The properties desired for the various elements sometimes require to carry out non-compatible treatments or treatments which may be harmful to the elements not directly concerned herewith. Moreover, the required isolation of the elements from each other or from the substrate, in which respect the circuitry of the device plays an important part, may impose definite requirements with respect to polarity and conductibility which may be less compatible with the properties of the various elements.

In most cases the substrate is provided, preferably by epitaxial growth, with one or more layers of the desired conductivity type, while the regions particularly of the active elements are formed by parts of said layers or are obtained by local diffusion of an impurity usually of the opposite conductivity type in a portion of one of these layers from a surface of one of them.

Moreover, the isolation of the active elements from each other or from the substrate is usually obtained by polarising in the reverse direction the junction between the region to be isolated and a zone of the opposite conductivity type, which surrounds the region concerned as completely as possible.

In a field-effect transistor, for instance, which comprises, as is known three regions i.e. one region (the channel) allowing current to pass between two regions, the control-electrode regions which are usually electrically integral with each other and whose common polarity affects the passage of current, it is important to have the channel surrounded by an electrode region of the opposite conductivity type so that the contact zones of said channel i.e. the source contact and the drain contact, remain accessible. The isolation of the control-electrode requires that it should be surrounded itself by a zone of the same conductivity type as the channel.

If an integrated circuit has to be arranged in a semiconductor body having a layer of the one conductivity type, grown epitaxially on a further layer, for example, the substrate of the other conductivity type, the isolation of a field-effect transistor having a channel of the one conductivity type gives rise to difficulties.

In such a structure usually a portion of the control-electrode of the field-effect transistor is formed by diffusion into the epitaxial surface layer, whereas a second portion is obtained partly by diffusion from the surface of the epitaxial surface layer in a region having such a configuration that the channel zone is surrounded by said electrode and the second part is completed by a part of the substrate.

A known solution consists in the diffusion of isolating zones across the semiconductor body which surround the device to be insulated, in this case the field-effect transistor. Owing to the thickness of the material to be traversed, these diffusions take, however, much time, so that the properties of the semiconductor body or of regions already provided may be deteriorated. Moreover, the impurities diffuse not only right across the body but also laterally so that the isolating zones occupy much space; the surface available for applying active or passive elements of the circuitry is thus restricted.

The invention has for its purpose inter alia to provide a method of manufacturing a field-effect transistor in a stratified semiconductor body having two layers of opposite conductivity types, in which the transistor comprises an epitaxial channel of the same conductivity type as the surface layer of the body and is isolated electrically from the subjacent layer.

The invention furthermore permits of arranging said transistor in a monolithic semiconductor device comprising a semiconductor body having layers of opposite conductivity types, in which other active or passive semiconductor elements are arranged, the transistor being insulated from the other elements and from the substrate.

A method of the kind set forth according to the invention is characterized in that a further portion of the control-electrode is formed by a buried layer of the opposite conductivity type, which is obtained by local diffusion from a pre-diffused region provided prior to the application of the epitaxial surface layer in the substrate and by a diffused surface zone of the opposite conductivity type extending down to the buried layer and surrounding, together with the buried layer, a portion of the epitaxial surface layer, in which the channel zone of the field-effect transistor is located, while a second buried layer of the one conductivity type is diffused from a pre-diffused region provided in the substrate prior to the application of the epitaxial surface layer, said further portion of the control-electrode being separated by the second buried layer from the substrate.

It should be noted that the substrate need not have a homogeneous composition; it may also consist of a semiconductor body of the one conductivity type provided with a surface layer of the other conductivity type.

The field-effect transistor obtained by the method according to the invention comprises an epitaxial channel so that by varying the resistivity of the epitaxial layer an optimum resistance per surface unit can be obtained, while the diffusion of the electrodes permits of obtaining a channel configuration of the optimum surface and thickness dimensions.

The application of the field-effect transistor by the method according to the invention is compatible with the application of other elements which have to be obtained simultaneously in the same semiconductor body. The method according to the invention permits in particular to provide simultaneously with the field-effect transistors concerned bipolar transistors and even complementary bipolar transistors, as well as passive elements.

A preferred embodiment of said method is characterized in that the isolated islands are obtained by the diffusion of isolating zones extending right across the epitaxial surface layer down into the substrate, while at the same time the control-electrode of the field-effect transistor is obtained.

It will be obvious that in the method according to the invention the number of required treatments for the manufacture of monolithic semiconductor devices comprising, apart from the field-effect transistors, further elements such as transistors, diodes or passive elements, is considerably reduced.

The invention furthermore relates to semiconductor devices comprising a field-effect transistor manufactured by the method according to the invention.

The invention will now be described more fully with reference to the accompanying drawing.

FIGS. 1*a* to 1*g* are diagrammatic sectional views taken on the lines I—I in FIG. 2 of a field-effect transistor having an n-type channel in various stages of the manufacture according to the invention.

In these figures corresponding elements are designated by the same reference numerals with corresponding indices.

Figure 1:
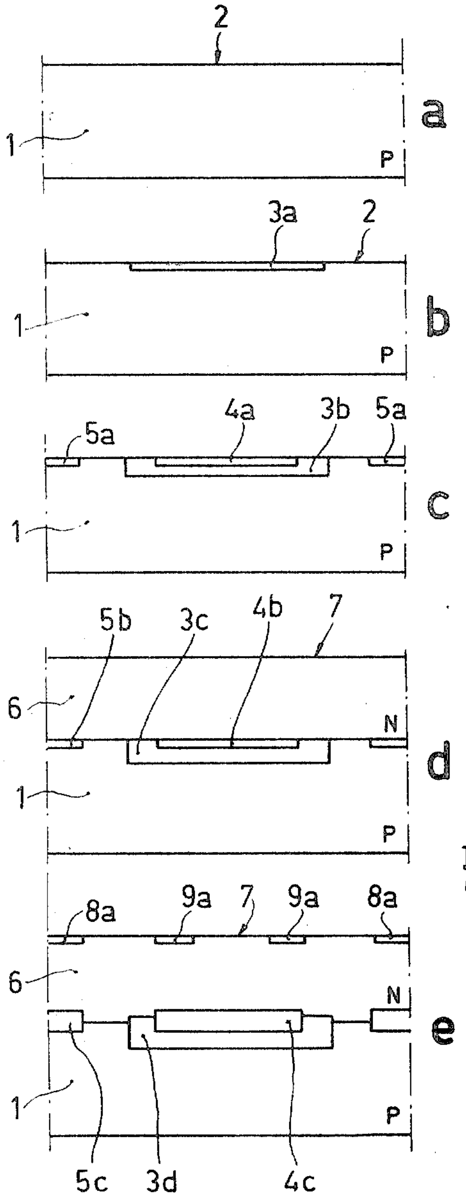

The surface oxide layers resulting from the various thermal treatments are not shown. The masking layers are not mentioned in this description, since the application of such layers and the provision of windows at the desired places for masking purposes can be obtained by known techniques.

There is neither made reference to the vapour depositions and pre-diffusions of impurities, since most diffusions are preceded by a pre-diffusion unless it is otherwise stated.

In the embodiment shown in FIGS. 1*a* to 1*g* a field-effect transistor having an n-type channel is described, but the same method may, of course, be employed for manufacturing a transistor having a p-type channel by reversing the conductivity types mentioned.

The method illustrated in FIGS. 1*a* to 1*g* starts from a substrate consisting of a monocrystalline semiconductor body 1 (p-type, FIG. 1*a*). An adequately prepared surface 2 is provided with a region 3*a* by diffusion of impurities determining a conductivity type opposite that of the body 1 (FIG. 1*b*). The prediffused region 3*a* has such a configuration and such a surface that the buried layer diffused subsequently from said region can laterally surround the buried part of the transistor on all sides.

Then the required isolating zones are diffused with such a configuration that they isolate the transistor. These p-type pre-diffusion regions are indicated at 5*a* in FIG. 1*c*. The isolating or second buried layer which isolates the control electrode from the substrate is indicated at 3*b* and part of this zone is provided with a region 4*a* by $p^+$-type pre-diffusion to form the buried layer of the control-electrode. The concentration obtained by this diffusion has to be sufficient to obtain p-type conductivity and a suitable resistivity of said buried layer.

It is advantageous to carry out simultaneously the diffusions of 4*a* and 5*a*.

Then the whole surface 2 of the substrate including the regions 4*a* and 5*a* is covered with an epitaxial surface layer 6 of a conductivity type suitable for the channel of the transistor, i.e. n-type conductivity.

The surface 7 of the epitaxial layer 6 (FIG. 1*e*) is then exposed to pre-diffusions 8*a* of the same conductivity type and of the same configuration as the region 5*a* (FIG. 1*c*) and simultaneously to a pre-diffusion 9*a* of the $p^+$-type above the buried layer 4*c* to form the surface zone of the further part of the control-electrode of the transistor, the last-mentioned pre-diffusion 9*a* providing a subsantially annular, at least closed configuration to surround completely the portion of the layer 6 which comprises the channel zone of the transistor.

The properties of the transistor depend inter alia upon the properties of the channel. The thickness of the channel is determined, in addition, by the subsequent treatment which consists in the diffusion of the region 10*a* into the surface 7 (FIG. 1*f*) to form the surface region of the control-electrode of the transistor. In this example a $p^+$-type diffusion is concerned.

Figure 2:
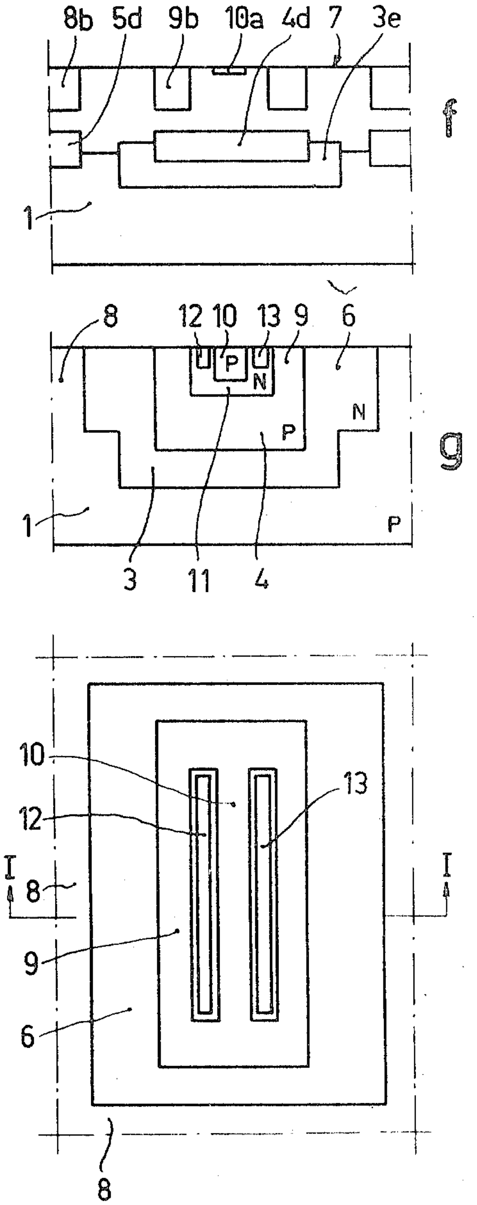
FIG. 2 is a plan view of said transistor.

FIG. 1*g*, which is a sectional view taken on the line I—I of FIG. 2, which is a plan view of the device, exhibits the final result after the various diffusions are completed by a last diffusion to obtain the zones 12 and 13 of the $n^+$-type with a high concentration to form the source and the drain respectively of the channel of the transistor. The control-electrode regions, termed the gate of the transistor, are indicated at 4 and 10; the layer 4 is completed by the zone 9 around the channel zone. This zone comprises the channel 11, the source electrode 12 and the drain electrode 13. The transistor itself is separated from the substrate and from the further elements provided in the same body by the junction between the regions 4 and 9 of the control-electrode and the regions 6 and 3 and the junction between the regions 6 and 3 and the isolating zones 8 and the substrate.

FIG. 2 shows a possible configuration of the transistor the manufacture of which is described above with reference to FIG. 1. It shows the surface-joining parts of the first zone of the control-electrode 10, of the second region of the control-electrode 9, of the channel source electrode 12 and of the channel drain electrode 13.

The epitaxial layer joins the surface at 6 and surrounds the transistor completely and the isolating zones join the surface at 8 and surround completely the region 6.

The two above-mentioned regions of the control-electrode co-operate so that flow of current beyond the channel proper is avoided, This is a conventional confiuguration for field-effect transistors. The geometrical shape of the transistor may be adapted to the desired properties. A high-frequency transistor for example requires other shape and dimensions than a high-power transistor.

Figure 3:
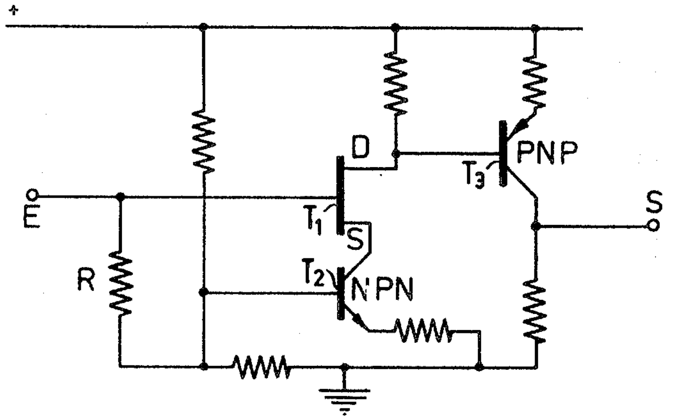
FIG. 3 shows by way of example a circuit diagram comprising a field-effect transistor and two complementary, bipolar transistors.

FIG. 3 shows by way of example the diagram of a circuit including a field-effect transistor $T_1$ and two complementary, bipolar npn- and pnp-type transistors $T_2$ and $T_3$ respectively. This amplifier circuit given as an example of the combination of these three types of transistors is preferably integrated in a monolithic semiconductor body by employing the method according to the invention. The diagrammatic sectional view of FIG. 4 indicates a field-effect transistor having an n-type channel, an npn-transistor and a pnp-transistor, for example those of the circuit of FIG. 3. The resistors R of this circuit may be readily integrated in such a body by using known techniques. These resistors are omitted from the sectional view of FIG. 4.

Said elements are arranged in a monocrystalline body formed by a substrate 31 of the p-type conductivity, to which an n-type epitaxial layer 32 is applied. The isolating zones 43 together with the substrate 31 surround islands that can be electrically insulated from each other polarizing in the reverse direction the junction formed by the isolating zones 43 and the substrate 31 with the regions, for example, 35, 40, 47 of opposite conductivity types.

The field-effect transistor according to the invention comprises a diffused p-type control-electrode, a region 33 of which is a buried layer which joins a contact zone 36, while the region 38 is provided on the surface. These two electrically interconnected regions form the gate of the transistor and the zones 37, 30 and 39 form the channel, the zone 37, for example, being the source contact and the zone 39 being the drain contact. This field-effect transistor is isolated from the substrate by the n-type zone 34, which is diffused in accordance with the invention prior to the application of the epitaxial layer 32.

The pnp-type bipolar transistor comprises a collector having a buried layer 45, which is connected to a contact zone 44 of low resistivity; this collector is isolated from the substrate by the n-type zone 39, which is also diffused prior to the application of the epitaxial layer 32. The base of the pnp-transistor is formed by a portion 42 of the n-type layer 32 with a diffused $n^+$-type contact zone 55. The emitter 41 is obtained in known manner by diffusion.

The npn-transistor comprises a collector 47 formed by a portion of the epitaxial layer 32. A buried n-type layer 46 is diffused to reduce the series resistance of this collector. The base 49 and the emitter 48 of this transistor are obtained in known manner by diffusion.

The zones 34, 39 and 46 are preferably diffused simultaneously. Also the zones 33 and 45, as well as the zones 36, 44 and the isolating zones 43 and the regions 38 and 41 may be diffused.

Figure 4:
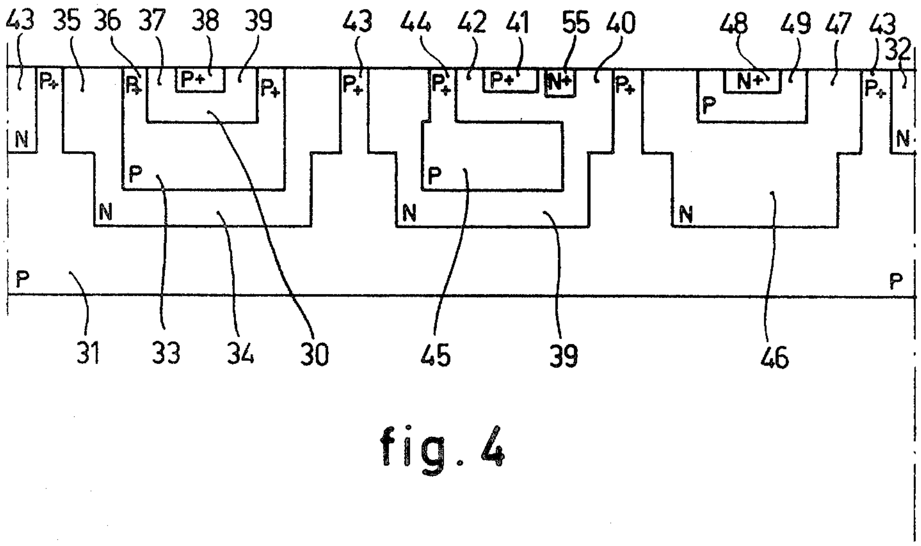
FIG. 4 is a diagrammatic sectional view of a monolithic device comprising a transistor according to the invention and two complementary, bipolar transistors.

In the device shown in FIG. 4 other semiconductor elements than those shown may be employed apart from the transistor according to the invention. Isolation by diffused zones 43 is not absolutely necessary. The elements may, as an alternative, be isolated from each other by grooves across the epitaxial layer 32, which grooves may be coated with a solid substance having isolating or non-isolating properties.

By way of example the most important stages of the manufacture of a field-effect transistor having an n-type channel, arranged in a body having an epitaxial layer on a substrate of the opposite conductivity type, manufactured by the method according to the invention, will be described hereinafter. The transistor $T_1$ of FIG. 3 is an example of a transistor which can be manufactured by the method to be described.

A monocrystalline p-type silicon body of a thickness of about 150/$\mu$ and a resistivity of about 5 ohm./cm. is exposed at the surface to a first n-type phosphorus prediffusion in a region corresponding to the isolating buried layer between the control-electrode of the transistor and the substrate, that is to say as far as beyond the surface intended for the buried part of the control-electrode. The surface concentration of this diffused zone is $10^{18}$ at./cc.

On the same surface is then carried out a p-type boron diffusion with a surface concentration of $10^{19}$ at./cc. in the regions intended for the buried part of the control-electrode and for the isolating zones forming the edges of the island in which the transistor has to be arranged.

After the removal of the oxide layer resulting from the preceding treatment an n-typeepitaxial layer with an impurity concentration $5\times10^{15}$ at./cc. and a resistivity of 1 ohm./cm. is applied in known manner; the thickness of this layer may be 15/$\mu$m.

The surface of this epitaxial layer is exposed to various diffusion treatments. In the first place boron is diffused with a surface concentration of about $10^{19}$ at./cc. from a prediffusion region corresponding to the isolating zone forming the edge of hte island accommodating the transistor. At the same time the contact zone of the control-electrode is obtained around that portion of the epitaxial layer which forms the channel of the transistor.

Then p-type boron is diffused into the same surface of the epitaxial layer with a surface concentration of about $10^{19}$ at./cc. to form the surface region of the control-electrode. The diffusion depth and the thickness of the buried part of the control-electrode have to be adjusted fairly accurately to each other in order to obtain a channel of given thickness, for example, 1/$\mu$.

A last phosphorus diffusion with a surface concentration of $10^{20}$ at./cc. serves to form the source and the drain of the channel of the transistor.

The device is finished by providing conductors, for example, in the form of metal tracks which are connected tothe source and drain electrodes and the control-electrode of the field-effect transistor. Such conductive tracks may be obtained in a conventional manner, for example, by vapour deposition.

The semiconductor body may then be provided with a conventional envelope.

As a matter of course, the embodiments described above may be modified within the scope of the invention by employing other technical means.

For example, different field-effect transistors may be used in the same device and other conventional isolating techniques may be used.

What is claimed is:

1. A method of manufacturing a semiconductor device comprising a junction field-effect transistor comprising the steps:

(1) prediuffusing a first buried layer of on-type conductivity into a surface of a substrate layer portion of the opopsite-type conductivity.

(2) prediffusing into the first buried layer a second buried layer of the opposite-type conductivity.

(3) growing on the said surface containing the first and second buried layers a single epitaxial layer of the one-type conductivity.

(4) forming by diffusion on the surface of the epitaxial layer overlying the second buried layer an annular third region of opposite-type conductivity.

(5) forming by diffusion on the surface of the epitaxial layer within and spaced from the third region a fourth region of opposite-type conductivity.

(6) forming by diffsuion on the surface of the epitaxial layer within the third region but outside of the fourth region fifth and sixth spaced regions of one-type conductivity.

(7) and heating the various layers and regions until the second buried layer out-diffuses to meet up with the indiffusing third region to form an inner control-electrode of the transistor, and the fourth region in-diffuses close to but spaced from the second buried layer to form therewith a channel region of the transistor constituted by the one-type material of the epitaxial layer, the fifth and sixth regions constituting source and drain contacts for the channel, and the cup-shaped volume formed by the out-diffusing second buried layer and the in-diffusing third region being isolated from the substrate layer by the first buried layer and the surrounding epitaxial layer portions.

2. A method as set forth in claim 1 and including the step of separating the epitaxial layer portion containing the aforementioned buried layers and regions into an island isolated from the remainder of the epitaxial layer.

3. A method as set forth in claim 2 wherein the isolated island is formed by diffusion of opposite-type zones through the epitaxial layer into the substrate at the same time that the third region is formed.

References Cited

UNITED STATES PATENTS

| | | | |
|---|---|---|---|
| 3,260,902 | 7/1966 | Porter | 148—175 UX |
| 3,327,182 | 6/1967 | Kisinko | 317—235–22.1 UX |
| 3,335,341 | 8/1967 | Lin | 317—22.1 |
| 3,379,584 | 4/1968 | Bean et al. | 148—175 |
| 3,380,153 | 4/1968 | Husher et al. | 148—175X |
| 3,412,460 | 11/1968 | Lin | 148—175X |
| 3,421,205 | 1/1969 | Pollock | 148—175X |
| 3,450,959 | 6/1969 | Dale | 148—175X |
| 3,457,125 | 7/1969 | Kerr | 148—187 |
| 3,460,006 | 8/1969 | Strull | 148—175X |

FOREIGN PATENTS

| | | | |
|---|---|---|---|
| 1,422,157 | 11/1965 | France | 317—235-22.1 |

WINSTON A. DOUGLAS, Primary Examiner

A. SHAPARS, Assistant Examiner

U.S. Cl. X.R.

29—580; 148—187; 317—235